United States Patent
Teng et al.

(10) Patent No.: US 11,622,034 B2
(45) Date of Patent: Apr. 4, 2023

(54) ELECTRONIC APPARATUS CAPABLE OF RECEIVING 5G MOBILE SIGNAL

(71) Applicants: Inventec (Pudong) Technology Corporation, Shanghai (CN); INVENTEC CORPORATION, Taipei (TW)

(72) Inventors: Pei-Ling Teng, Taipei (TW); Chih-Cheng Li, Taipei (TW)

(73) Assignees: Inventec (Pudong) Technology Corporation, Shanghai (CN); INVENTEC CORPORATION, Taipei (TW)

(*) Notice: Subject to any disclaimer, the term of this patent is extended or adjusted under 35 U.S.C. 154(b) by 308 days.

(21) Appl. No.: 16/993,273

(22) Filed: Aug. 14, 2020

(65) Prior Publication Data

US 2021/0392215 A1 Dec. 16, 2021

(30) Foreign Application Priority Data

Jun. 10, 2020 (CN) .......................... 202010524272.7

(51) Int. Cl.
*G06F 3/038* (2013.01)
*H05K 1/02* (2006.01)
*H04M 1/02* (2006.01)
*H05K 1/11* (2006.01)
*H01Q 1/24* (2006.01)

(52) U.S. Cl.
CPC .......... *H04M 1/0266* (2013.01); *H01Q 1/243* (2013.01); *H05K 1/0215* (2013.01); *H05K 1/118* (2013.01)

(58) Field of Classification Search
CPC ... H04M 1/0266; H05K 1/0215; H05K 1/118; G06F 3/02; G06F 3/038; G09G 5/00
See application file for complete search history.

(56) References Cited

U.S. PATENT DOCUMENTS

| | | | | |
|---|---|---|---|---|
| 9,503,173 | B2* | 11/2016 | McCarthy | H04B 7/0871 |
| 2002/0021250 | A1* | 2/2002 | Asano | H01Q 21/30 |
| | | | | 343/702 |
| 2020/0393936 | A1* | 12/2020 | Bok | H01Q 1/44 |
| 2021/0193012 | A1* | 6/2021 | Jung | H01Q 13/10 |
| 2021/0280971 | A1* | 9/2021 | Kim | H01Q 21/065 |

* cited by examiner

*Primary Examiner* — Pegeman Karimi
(74) *Attorney, Agent, or Firm* — CKC & Partners Co., LLC

(57) ABSTRACT

An electronic apparatus includes a display module and a plurality of metallic elements. The metallic elements at least partially surround at least three sides of the display module to form a metallic frame. The metallic frame is configured to receive a fifth generation (5G) mobile signal, in which adjacent two of the metallic elements have a gap therebetween.

7 Claims, 5 Drawing Sheets

ELECTRONIC APPARATUS CAPABLE OF RECEIVING 5G MOBILE SIGNAL

RELATED APPLICATIONS

This application claims priority to Chinese Application Serial Number 202010524272.7 filed Jun. 10, 2020, which is herein incorporated by reference.

BACKGROUND

Technical Field

The present disclosure relates to electronic apparatus. More particularly, the present disclosure relates to electronic apparatus which can receive a fifth generation (5G) mobile signal.

Description of Related Art

With the increase of living qualities of people, the demand of people for electronic products has also been increasing. Correspondingly, in order to fulfill the increasing demand of the consumers, the manufacturers have been working hard to improve the electronic products. For example, with regards to the electronic products with a display screen, apart from constantly improving the functions and the operational efficiency, the appearance is often an important part which the consumers highly concern.

However, since the application of fifth generation (5G) mobile signal becomes popular, how to dispose an antenna structure especially for the fifth generation mobile signal, under the condition that the slim and thin appearance of the electronic product has to be maintained, is undoubtedly also an important issue to the industry.

SUMMARY

A technical aspect of the present disclosure is to provide an electronic apparatus, which can receive a fifth generation mobile signal, and can also achieve the design of narrow frame.

According to an embodiment of the present disclosure, an electronic apparatus includes a display module and a plurality of metallic elements. The metallic elements at least partially surround at least three sides of the display module to form a metallic frame. The metallic frame is configured to receive a fifth generation (5G) mobile signal, in which adjacent two of the metallic elements have a gap therebetween.

In one or more embodiments of the present disclosure, a quantity of the gap is plural. The electronic apparatus further includes a plurality of non-conductive elements. The non-conductive elements are respectively located at the gaps.

In one or more embodiments of the present disclosure, each of the metallic elements is at least partially in a form of a strip.

In one or more embodiments of the present disclosure, the electronic apparatus further includes a radio frequency module, a system module and a flexible printed circuit board. The system module includes a grounding element. The flexible printed circuit board includes a plurality of feeding lines and a plurality of grounding lines. Each of the feeding lines is electrically connected with the corresponding metallic element and the radio frequency module. Each of the grounding lines is electrically connected with the corresponding metallic element and the grounding element.

In one or more embodiments of the present disclosure, a quantity of the feeding lines electrically connecting with one of the metallic elements is different from a quantity of the feeding lines electrically connecting with another one of the metallic elements.

In one or more embodiments of the present disclosure, a quantity of the grounding lines electrically connecting with one of the metallic elements is different from a quantity of the grounding lines electrically connecting with another one of the metallic elements.

In one or more embodiments of the present disclosure, each of the metallic elements has a contact area. The contact area is adjacent to the corresponding gap and is configured to electrically connect with at least one of the feeding lines and at least one of the grounding lines.

In one or more embodiments of the present disclosure, the flexible printed circuit board further includes at least one electronic element. The electronic element is adjacent to the corresponding feeding line and is configured to debug the corresponding metallic element.

When compared with the prior art, the above-mentioned embodiments of the present disclosure have at least the following advantages:

(1) Since the metallic frame has the function of receiving the fifth generation mobile signal, no antenna structure is required to be additionally disposed on the electronic apparatus and thus no inner space of the electronic apparatus will be occupied for any additional antenna structure. In this way, apart from allowing the electronic apparatus to receive the fifth generation mobile signal, the electronic apparatus can also achieve the design of narrow frame.

(2) Through the arrangement of unequal quantities of the feeding lines and the grounding lines connected to the corresponding metallic element, the resonance pattern of the antennas can be effectively achieved, and the electronic element can be matched to excite the frequency band and the bandwidth as required.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
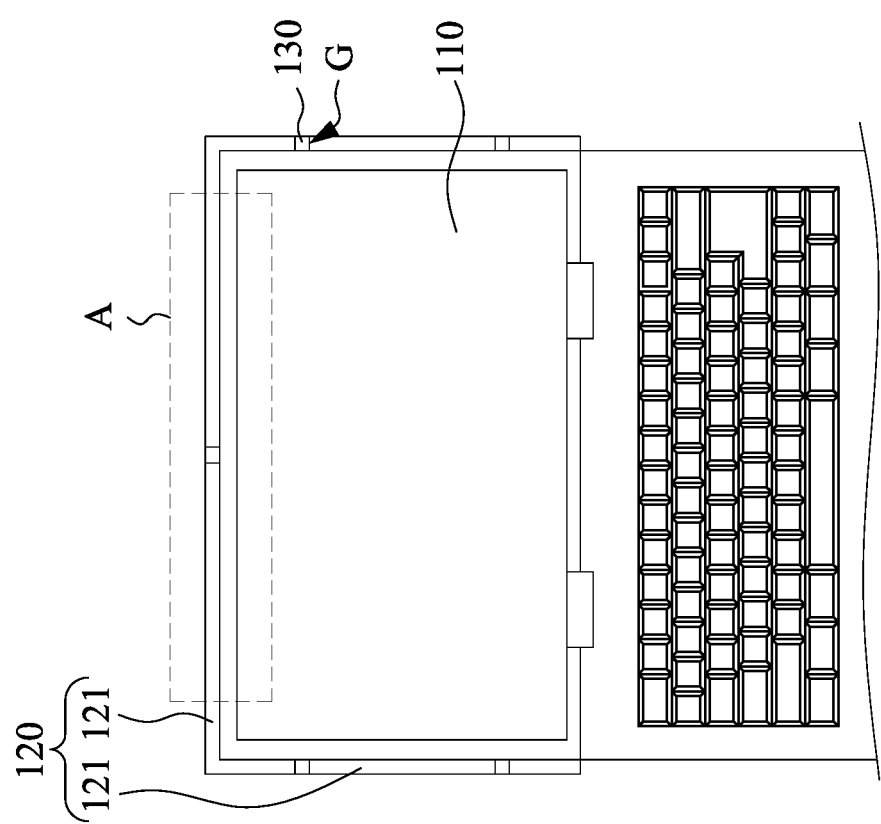
FIG. 1 is a front view of an electronic apparatus according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
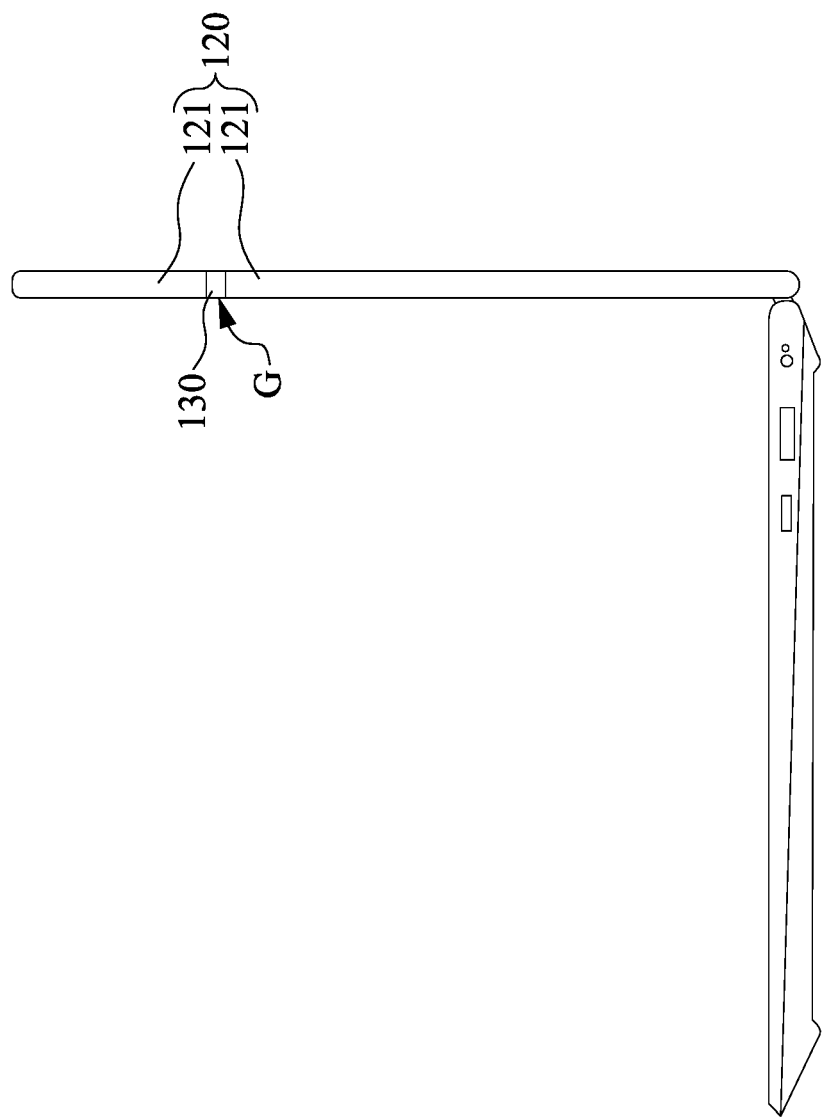
FIG. 2 is a side view of the electronic apparatus of FIG. 1.

Reference is made to FIGS. 1-2. FIG. 1 is a front view of an electronic apparatus 100 according to an embodiment of the present disclosure. FIG. 2 is a side view of the electronic apparatus of FIG. 1. In this embodiment, the present disclosure provides an electronic apparatus 100. In practice, the electronic apparatus 100 can be a smart phone, a tablet or a notebook computer. However, this does not intend to limit the present disclosure. For example, as shown in FIGS. 1-2, the electronic apparatus 100 is a notebook computer and includes a display module 110 and a plurality of metallic elements 121. Each of the metallic elements 121 is at least partially in a form of a strip, and the metallic elements 121 at least partially surround at least three sides of the display module 110 to form a metallic frame 120. The metallic frame 120 functions as an antenna and is configured to receive a fifth generation (5G) mobile signal. It is worth to note that, adjacent two of the metallic elements 121 have a gap G therebetween. The gap G prevents adjacent two of the metallic elements 121 from producing any electromagnetic interference to each other, such that the quality of the receipt of the fifth generation mobile signal can be guaranteed. Moreover, through the determination of the specific positions of the gaps G, the metallic elements 121 of different lengths can be obtained, such that the user can fulfill the technical requirement of the electronic apparatus 100 to receive the fifth generation mobile signal according to the actual situation in a simple and easy manner.

As mentioned above, since the metallic frame 120 has the function of receiving the fifth generation mobile signal, no antenna structure is required to be additionally disposed on the electronic apparatus 100 and thus no inner space of the electronic apparatus 100 will be occupied for any additional antenna structure. In this way, apart from allowing the electronic apparatus 100 to receive the fifth generation mobile signal, the electronic apparatus 100 can also achieve the design of narrow frame.

In addition, in practical applications, a quantity of the gap G between the metallic elements 121 is plural. Moreover, the electronic apparatus 100 further includes a plurality of non-conductive elements 130. The non-conductive elements 130 are respectively located at the gaps G between the metallic elements 121, in order to further prevent adjacent two of the metallic elements 121 from producing any electromagnetic interference to each other, such that the quality of the receipt of the fifth generation mobile signal can be guaranteed.

Figure 3:
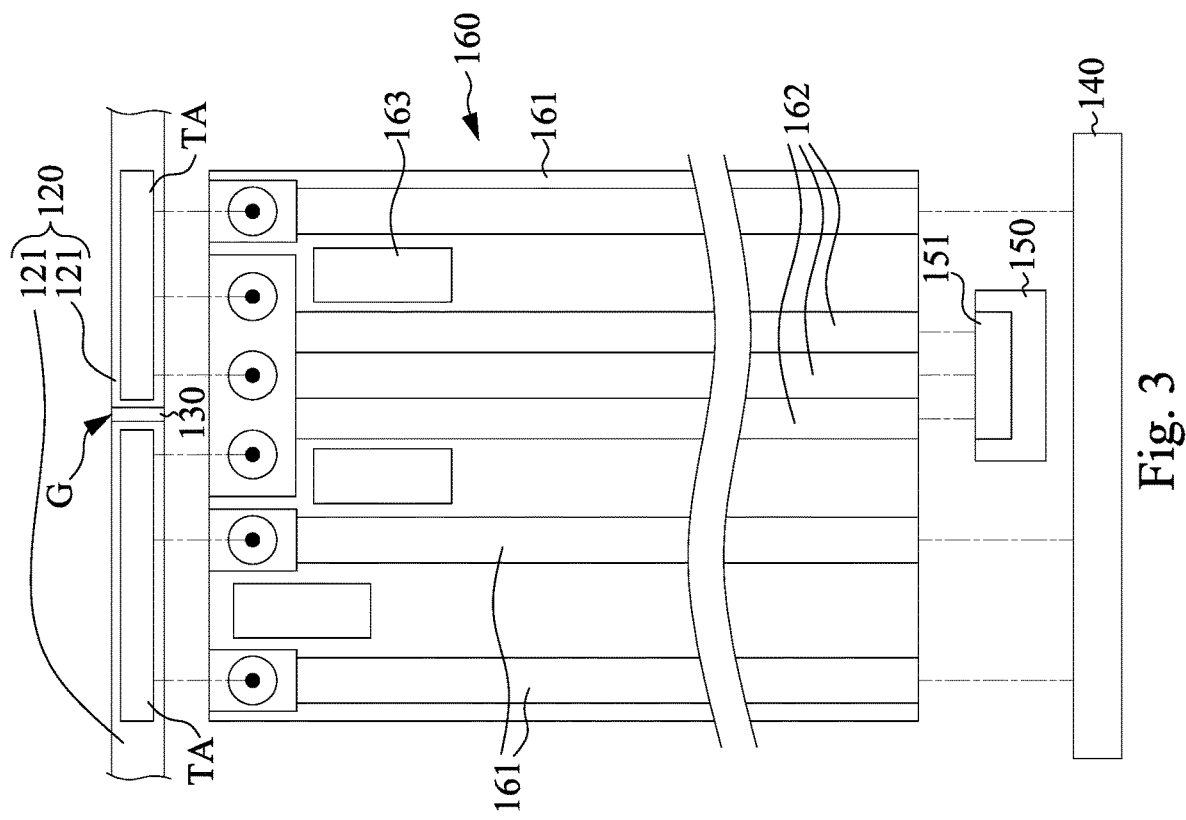
FIG. 3 is a partially enlarged view of Area A of FIG. 1.

Reference is made to FIG. 3. FIG. 3 is a partially enlarged view of Area A of FIG. 1. FIG. 3 is practically also a diagram to show the electrical connections of the metallic elements 121. In this embodiment, as shown in FIG. 3, the electronic apparatus 100 further includes a radio frequency module 140, a system module 150 and a flexible printed circuit board 160. The system module 150 includes a grounding element 151. The flexible printed circuit board 160 includes a plurality of feeding lines 161 and a plurality of grounding lines 162. Each of the feeding lines 161 is electrically connected with the corresponding metallic element 121 and the radio frequency module 140, while each of the grounding lines 162 is electrically connected with the corresponding metallic element 121 and the grounding element 151 of the system module 150, in order to excite or suppress the radiation produced during the receipt of the fifth generation mobile signal. To keep the figures concise, except FIG. 3, the radio frequency module 140, the system module 150 and the flexible printed circuit board 160 are not shown in other figures.

Moreover, as shown in FIG. 3, each of the metallic elements 121 has a contact area TA. The contact area TA is adjacent to the corresponding gap G and is configured to electrically connect with at least one of the feeding lines 161 and at least one of the grounding lines 162. In practical applications, each of the feeding lines 161 and each of the grounding lines 162 can respectively be electrically connected with the contact area TA of the metallic element 121 through an elastic spring (not shown).

In addition, as shown in FIG. 3, the flexible printed circuit board 160 further includes at least one electronic element 163. The electronic element 163 is adjacent to the corresponding feeding line 161 and is configured to debug the corresponding metallic element 121. For example, the electronic element 163 can be a radio frequency switch or a tuner. However, this does not intend to limit the present disclosure.

It is worth to note that, in this embodiment, a quantity of the feeding lines 161 electrically connecting with one of the metallic elements 121 is different from a quantity of the feeding lines 161 electrically connecting with another one of the metallic elements 121. Moreover, a quantity of the grounding lines 162 electrically connecting with one of the metallic elements 121 is different from a quantity of the grounding lines 162 electrically connecting with another one of the metallic elements 121. For example, as shown in FIG. 3, a quantity of the feeding lines 161 electrically connecting with the metallic element 121 on the left side of FIG. 3 is two, while a quantity of the feeding lines 161 electrically connecting with the metallic element 121 on the right side of FIG. 3 is one. Moreover, a quantity of the grounding lines 162 electrically connecting with the metallic element 121 on the left side of FIG. 3 is one, while a quantity of the grounding lines 162 electrically connecting with the metallic element 121 on the right side of FIG. 3 is two. In this way, through the arrangement of unequal quantities of the feeding lines 161 and the grounding lines 162 connected to the corresponding metallic element 121 as mentioned above, the resonance pattern of the antennas can be effectively achieved, and the electronic element 163 can be matched to excite the frequency band and the bandwidth as required. It is worth to note that, as shown in FIG. 3, the grounding lines 162 can be mutually connected as one single structure on the flexible printed circuit board 160. However, this does not intend to limit the present disclosure.

Figure 4:
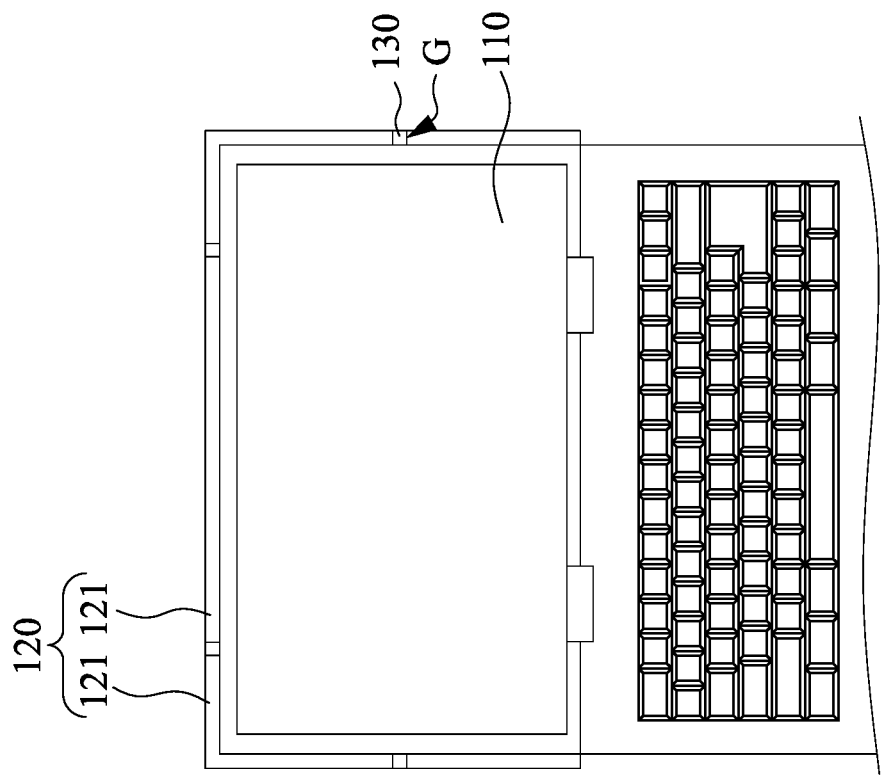
FIG. 4 is a front view of an electronic apparatus according to another embodiment of the present disclosure.

Reference is made to FIG. 4. FIG. 4 is a front view of an electronic apparatus 100 according to another embodiment of the present disclosure. In this embodiment, as shown in FIG. 4, the quantity and the position of the gaps G between the metallic elements 121 are different from that of the embodiment shown in FIG. 1 as mentioned above. For example, on the top of the metallic frame 120 in FIG. 4, two of the gaps G are disposed according to the actual situation. On the left side and the right side of the metallic frame 120 in FIG. 4, only one of the gaps G is respectively disposed according to the actual situation. In other words, the lengths of the metallic elements 121 can be flexibly adjusted according to the actual situation, such that the user can fulfill the technical requirement of the electronic apparatus 100 to receive the fifth generation mobile signal in a simple and easy manner.

Figure 5:
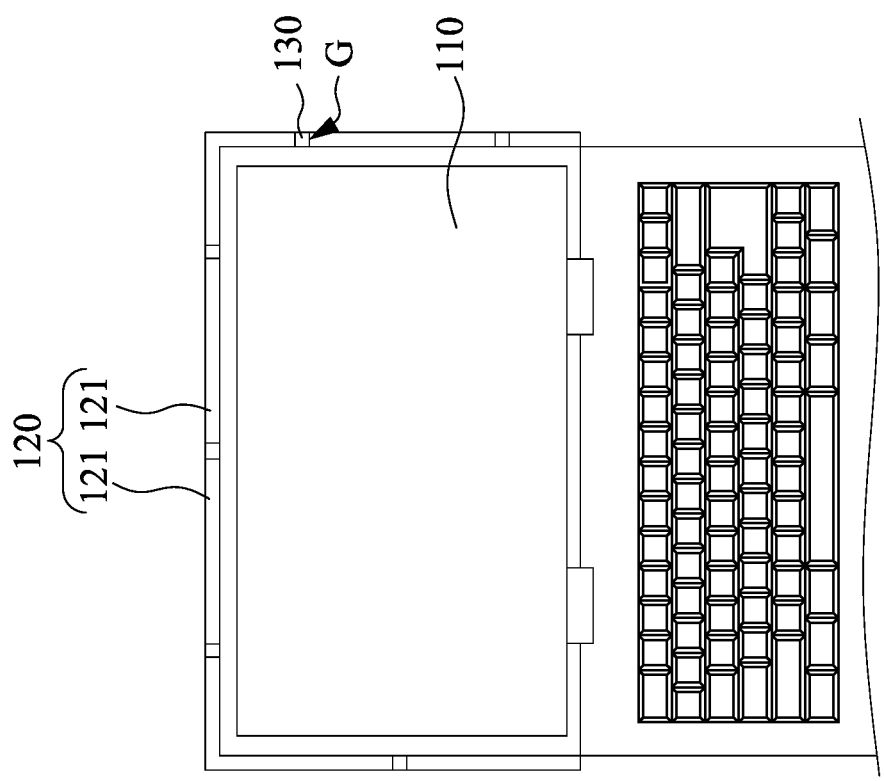
FIG. 5 is a front view of an electronic apparatus according to a further embodiment of the present disclosure.

Reference is made to FIG. 5. FIG. 5 is a front view of an electronic apparatus 100 according to a further embodiment of the present disclosure. In this embodiment, as shown in FIG. 5, the quantity and the position of the gaps G disposed on the left side and the right side of the metallic frame 120 can be different from each other according to the actual situation. For example, on the left side of the metallic frame 120 in FIG. 5, only one of the gaps G is disposed. Meanwhile, on the right side of the metallic frame 120 in FIG. 5, two of the gaps G are disposed. In other words, the lengths of the metallic elements 121 can be flexibly adjusted according to the actual situation, such that the user can fulfill the technical requirement of the electronic apparatus 100 to receive the fifth generation mobile signal in a simple and easy manner.

In conclusion, when compared with the prior art, the aforementioned embodiments of the present disclosure have at least the following advantages:

(1) Since the metallic frame has the function of receiving the fifth generation mobile signal, no antenna structure is required to be additionally disposed on the electronic apparatus and thus no inner space of the electronic apparatus will be occupied for any additional antenna structure. In this way, apart from allowing the electronic apparatus to receive the fifth generation mobile signal, the electronic apparatus can also achieve the design of narrow frame.

(2) Through the arrangement of unequal quantities of the feeding lines and the grounding lines connected to the corresponding metallic element, the resonance pattern of the antennas can be effectively achieved, and the electronic element can be matched to excite the frequency band and the bandwidth as required.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. An electronic apparatus, comprising:
a display module;
a plurality of metallic elements at least partially surrounding at least three sides of the display module to form a metallic frame, the metallic frame being configured to receive a fifth generation (5G) mobile signal, wherein adjacent two of the metallic elements have a gap therebetween;
a radio frequency module;
a system module comprising a grounding element; and
a flexible printed circuit board comprising a plurality of feeding lines and a plurality of grounding lines, each of the feeding lines electrically connecting with the corresponding metallic element and the radio frequency module, each of the grounding lines electrically connecting with the corresponding metallic element and the grounding element.

2. The electronic apparatus of claim 1, wherein a quantity of the gap is plural, the electronic apparatus further comprises:
a plurality of non-conductive elements respectively located at the gaps.

3. The electronic apparatus of claim 1, wherein each of the metallic elements is at least partially in a form of a strip.

4. The electronic apparatus of claim 1, wherein a quantity of the feeding lines electrically connecting with one of the metallic elements is different from a quantity of the feeding lines electrically connecting with another one of the metallic elements.

5. The electronic apparatus of claim 1, wherein a quantity of the grounding lines electrically connecting with one of the metallic elements is different from a quantity of the grounding lines electrically connecting with another one of the metallic elements.

6. The electronic apparatus of claim 1, wherein each of the metallic elements has a contact area adjacent to the corresponding gap and configured to electrically connect with at least one of the feeding lines and at least one of the grounding lines.

7. The electronic apparatus of claim 1, wherein the flexible printed circuit board further comprises:
at least one electronic element adjacent to the corresponding feeding line and configured to debug the corresponding metallic element.

* * * * *